(12) United States Patent
Gorin et al.

(10) Patent No.: US 7,439,897 B1
(45) Date of Patent: Oct. 21, 2008

(54) STAGGERED INTERLEAVED NYQUIST REGIONS AVOID GUARD BAND INDUCED HOLES WHEN SAMPLING A BAND LIMITED SIGNAL

(75) Inventors: Joseph M. Gorin, Santa Rosa, CA (US); Kenneth D. Poulton, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/740,656

(22) Filed: Apr. 26, 2007

(51) Int. Cl.
*H03M 1/12* (2006.01)

(52) U.S. Cl. ...................... 341/155; 341/123

(58) Field of Classification Search .............. 341/139, 341/155, 132, 172, 123; 381/106, 101, 94.5, 381/102

See application file for complete search history.

(56) References Cited

U.S. PATENT DOCUMENTS

| | | | | |
|---|---|---|---|---|
| 6,937,912 | B1 * | 8/2005 | Orban ........................ | 700/94 |
| 6,963,733 | B2 * | 11/2005 | Eriksson et al. ............. | 455/132 |
| 7,030,800 | B2 * | 4/2006 | Arai et al. ................... | 341/155 |
| 7,218,258 | B2 * | 5/2007 | Delanghe et al. ............ | 341/118 |
| 7,227,489 | B2 * | 6/2007 | Tryggvason et al. ........ | 341/155 |

OTHER PUBLICATIONS

Angelo Ricotta, "Undersampling Sodar Signals", in the article "Turning Nyquist upside down by undersampling", pp. 1-12, Oct. 5, 2006, http://spazioscuola.altervista.org/UndersamplingAR/UndersamplingARnv.htm.
"Nyquist-Shannon Sampling theorem", Wikipedia, pp. 1-15, Oct. 5, 2006, http://en.wikipedia.org/wiki/Nyquist%E2%80%93Shannon_sampling_theorem.
"Aliasing", Wikipedia, pp. 1-7, Oct. 5, 2006, http://en.wikipedia.org/wiki/Aliasing.
"Anti-aliasing", Wikipedia, pp. 1-6, Oct. 5, 2006, http://en.wikipedia.org/wiki/anti-aliasing.

(Continued)

*Primary Examiner*—Brian Young

(57) ABSTRACT

Staggered interleaved Nyquist regions associated with differing ADC clock rates ($F_{CLK}$) avoids spectrum lost through disjoint guard bands at the end of or between adjacent Nyquist regions. The staggered interleaved Nyquist regions overlap by an amount at least as much as is consumed by the guard bands. Selectable anti-aliasing filters associated with each Nyquist region and its ADC clock rate are used to enforce the staggered Nyquist regions and their various guard bands. For example, and neglecting guard bands, an initial raw band of operation $RB_1$ may be the First Nyquist region for a basic sampling frequency $F_s$. An adjacent raw band of operation $RB_2$ that overlaps $RB_1$ may be the Second Nyquist region for an alternate sampling frequency $2F_s/3$. An adjacent raw band of operation $RB_3$ that overlaps $RB_2$ may be the Second Nyquist region for the basic sampling frequency $F_s$. These raw bands interleave and overlap:

| | | | | |
|---|---|---|---|---|
| $RB_1$: | DC | to | $F_s/2$ | 1st Nyq. for $F_{CLK} = F_s$ |
| $RB_2$: | $(2/3)F_s - (1/2)(2/3F_s) = F_s/3$ | to | $2(2F_s/3)/2 = 2F_s/3$ | 2nd Nyq. for $F_{CLK} = 2F_s/3$ |
| $RB_3$: | $F_s - (1/2)F_s = F_s/2$ | to | $2(F_s/2) = F_s$ | 2nd Nyq. for $F_{CLK} = F_s$ |

In this example the smallest overlap is $F_s/6$. We then select widths for guard bands that do not exceed $F_s/6$. Additional ADC clock rates and anti-aliasing filters may be used to operate in still higher Nyquist regions.

19 Claims, 3 Drawing Sheets

OTHER PUBLICATIONS

M.E. Van Valkenburg, "Network Analysis", TK3226 V3 1974, Transforms of Other Signal Waveforms, Chapter 8, pp. 222-233.
"Sinc function", Wikipedia, p. 1-3, Oct. 5, 2006, http://en.wikipedia.org/wiki/Sinc_function.
"Sinc filter", Wikipedia, p. 1, Oct. 5, 2006, http://en.wikipedia.org/wiki/Sinc_filter.
"Anti-aliasing filter", Wikipedia, pp. 1-2, Oct. 5, 2006, http://en.wikipedia.org/wiki/anti-aliasing_filter.
"Downsampling", Wikipedia, pp. 1-2, Oct. 5, 2006, http://en.wikipedia.org/wiki/Downsampling.
"Reconstruction filter", Wikipedia, p. 1, Oct. 5, 2006, http://en.wikipedia.org/wiki/Reconstruction_filter.

* cited by examiner

STAGGERED INTERLEAVED NYQUIST REGIONS AVOID GUARD BAND INDUCED HOLES WHEN SAMPLING A BAND LIMITED SIGNAL

BACKGROUND

The application of digital techniques to the testing and analysis of the analog properties of signals has allowed the development of equipment able to perform, with precision, a wide variety of tests and analysis that are difficult or impossible to perform with purely analog techniques. To cite just one example, a spectrum analyzer whose internal operation is of a digital nature can, for a relatively modest expenditure of additional computational resources, provide phase information in addition to amplitude, and can then provide information about a signal's modulation. In this connection with this particular example, IQ modulation is a very general form of modulation that is specified through amplitude/phase pairs, and both Amplitude Modulation and Frequency Modulation can be described as special cases of IQ modulation, not to mention the various specialized types of IQ modulation that are used as various standards of digital modulation. To achieve the same degree of functionality (not to mention reliability, small size and low power consumption) with the purely analog techniques of several decades ago is altogether impractical.

The starting point for the digital treatment of analog properties of a waveform is the application of the waveform of interest to an ADC (Analog to Digital Converter). This is a circuit that accepts an analog signal as its input and produces an output that is a numeric code of n-many bits taken at some sample rate, usually regular in that the samples are equally spaced in time. The n-many bits are sometimes regular binary, sometimes a Gray code (adjacent codes in a monotonic sequence differ by a transition in only one bit position), with larger values for n producing higher resolution. Six, eight and ten are common values of n; sometimes n might be smaller and sometimes it is larger. There is a generally accepted tradeoff concerning n and how fast the ADC can operate: above some limits, faster operation is facilitated by a smaller value of n, and for a given n, there is a limit on how fast the ADC can go.

Before proceeding, we should dispose of one potentially confusing aspect related to terminology: this business of 'digital' and 'analog' signals. We view this as an issue related to how signals are used to represent information. At the lowest level of abstraction any tangible signal has an analog nature in the sense that it is something measurable and persists for some period of time. In short, it exists as "something real," and there might be a little more of it one time and a little less another. An 'analog signal' is a signal the very stuff of which is used to convey the information of interest. That is, some continuously variable property of the signal IS the information (e.g., at what rate is the signal changing, what are its levels, etc.) A 'digital signal' is essentially a code represented by some analog property of that signal, or most frequently, collection of such signals. The analog properties of the signal are only used to convey the digital code, and within very broad limits minor variations in those analog properties will not change the code at all. It is noted that we are ignoring here the entire notion of 'digital' logic, and of its AND, OR and NOR gates, etc. Insofar as the analog behavior of those 'digital' signals comports with the rules for correctly expressing encoded content, we are content to call them 'digital' signals and otherwise ignore their analog nature. It is a convenient fiction related to the manner in which signals are intended to convey information. In this sense, analog signals are their own representation, as it were, of their information content, and various circuits do various things to their properties. This is the realm of 'traditional' analog electronics. The sense in which we will use the notion of 'digital signals' is in the discrete numerical representation of some analog property that probably came from some 'signal' of interest. Much competent 'traditional electronics' can be needed to correctly get that numerical representation, but once it is on hand the way it is manipulated is arithmetic (as is data by a computer), not 'electronically' (e.g., push-pull amplification in an amplifier), although electronics will undoubtedly provide the means to do it (just as it does within a computer).

In any event, the fundamental philosophy of the digital treatment of a signal's analog properties is to digitize the analog signal with an ADC having suitable resolution, store the numeric (digital) values in a memory and process the data either in real time or via post processing, depending upon the application. 'Processing' usually means computation using the stored numeric values.

The selection of the number n for the resolution provided by the ADC is not the only major parameter of ADC performance (of which there are several . . . ) that is of interest. Of particular interest is the sustained rate at which the ADC can track or respond to a changed analog input and provide a new digital output. The experience of early real-time DSOs (Digital Sampling Oscilloscopes) is illustrative. It was readily appreciated that one had to sample a signal 'faster than it changed' in order to create a faithful trace whose waveform might be arbitrary, and more importantly, occurred perhaps just once. (Repetitive waveforms, on the other hand, lend themselves to being sampled at a low rate while letting the location of the samples "drift across" the waveform to build up an "equivalent time" acquisition record over many passes that could not be obtained as a single unified "real time' acquisition record by sampling one signal instance densely—which is to say, faster.) A somewhat simplistic early view of what the sampling did was that it produced a trace composed of just dots-at-amplitudes that, when they were close enough together along the time axis, provided a useable replica (a trace) of the real waveform. Clearly, frequency components within the original signal and whose periods were less than the time between samples would not contribute correctly to the replica represented by the trace. It was soon appreciated, however, that their presence in the original at the time it is applied to the ADC can actually do a fair amount of damage to the replica, and it was seen as necessary to apply a low pass filter to the signal before sampling it.

The analysis of Fourier that allowed any repetitive waveform to be decomposed and then expressed as a summation of sinusoids of particular frequencies, amplitudes and phases was neither unknown nor unappreciated, but the hardware (low cost memory and fast arithmetic processors) and practical algorithms needed to take advantage of this knowledge, took a few years for commercial development and refinement to occur. Computer programs that analyzed complex waveforms existed from the earliest days of computing. This algorithmic capability wasn't yet in an oscilloscope, or any other test equipment. As that further development and refinement occurred, the theorems of Nyquist and Shannon became the gate keepers of what data should be converted from analog to digital to perform what has come to be called DSP (for Digital Signal Processing). Entire DSP processing mechanisms were eventually reduced to integrated circuitry, and the modern DSO was afoot (as was an architectural revolution for many other types of test equipment). With ADCs and DSPs it was possible to sample 'at about' twice the rate of the highest frequency component of interest and let the algorithms 'find all the dots.' That is, it is even possible to create a nice smooth 'stretched-out' segment of displayed trace that appears to have all its pixels in wonderful harmony, when in reality only samples corresponding to 'about' every $n^{th}$ pixel have actually been taken. Such is the power of Nyquist and Fourier as combined in modern DSP techniques.

So, we are not surprised that, in certain applications such as real time DSOs and other items of high frequency test equipment such as spectrum analyzers, there is an urge for the ADC (a digitizer) to 'go fast.' In the usual terminology, which is the one we shall use below, the ADC has a certain sampling rate or frequency $F_S$ at which it operates. While an ADC might sometimes be operated at less that its maximum $F_S$, it does have such a maximum, and for a great many applications the highest frequency component $F_{MAX}$ that a signal will be allowed to approach (but not reach) will be $F_{MAX}=F_S/2$. An anti-aliasing filter will be used to enforce that requirement before the signal is applied to the ADC. Failure to do so can create great mischief. For example, consider a one megahertz sine wave that is (too slowly) sampled every one micro-second, and let's say these numbers are exact. Every sample is going to have the same value, depending upon the phase of the sampling regime relative to the signal. The sine wave has been converted into a straight line. It is most unlikely that such is what was intended. On the other hand, if we observe the Nyquist requirement and either sample at less than every half micro-second, or keep the original sampling rate and limit the signal to less than half a megahertz, then we get samples that faithfully preserve the original information and support an analysis or even a reconstruction of the original waveform.

There is yet another aspect of high speed ADC operation that needs appreciation. When the speed of ADC operation (i.e., its rate of sustained conversion) gets above that at which available memory (e.g., RAM, or Random Access Memory, which is to say, read-write memory) can store that data at a sustained rate, some interesting arrangements emerge, such as the interleaving of memory into banks, placing custom memory cells onto the same IC (Integrated Circuit) substrate as the ADC, etc. In short, things get complicated at the implementation level, even though at the simplified block diagram level it appears simply that an analog signal is digitized by an ADC and the digital words stored in a memory. So, in many high performance items of electronic test equipment the owner is somewhat dismayed to discover that she cannot increase the size of its memory with the same ease that has become usual and customary in the realm of computers, whether of the Personal or Workstation variety. It is not just an issue of does the processor provide the extra addressing; the authors of the embedded system within the test equipment knew ahead of time that such simply was not going to happen, because of a specialized non-standard manner in which that memory was closely coupled to the operation of the ADC in order to obtain the desired speed of operation.

Thus, when someone contemplating a new instrument design opines that "We need an ADC that goes twice (or three) times as fast as what is available . . . " it might not be simply a matter of finding somebody who knows how to provide it. A whole bunch of other stuff may also need to be bored out to permit the increase in performance. On the one hand, this might merely be a recipe for an expensive top-of-the-line item of test equipment (assuming all the relevant problems can be solved), or, on the other, it might be a boundary above which performance does not rise, regardless of the expense incurred (we simply can't make an ADC that runs faster, or if we did, we can't store the data . . . ).

Sometimes, when the answer to the question is unpleasant or inconvenient, there may be a way to get a more satisfactory answer if we discover a somewhat different question to ask. So, if we are ordinarily faced with digitizing signals that occupy a frequency band $B_{IN}$ of DC to $F_{MAX}$, and the Nyquist requirement tells us to sample signals in $B_{IN}$ at a sampling rate $F_S>2F_{MAX}$, and it so happens that we do not have at our disposal an ADC that operates any faster than $F_{MAX}$, we might ask what advantages accrue to us that we might exploit if we could guarantee that a signal $F_{IN}$ that we were interested in at any one time always stayed in the region DC to $F_{MAX}/2$ or in $F_{MAX}/2$ to $F_{MAX}$. That is, it stays nicely in either the bottom half or the upper half of $B_{IN}$. Suppose it does. The customary response is to divide $B_{IN}$ into two bands $B_1$ and $B_2$. We then treat digitized material for $B_1$ as adequately Nyquist compliant in something we will call the "First Nyquist region" (DC to $F_S/2$), provided it truly was always within $B_1$, while digitized material for $B_2$ is likewise adequately Nyquist compliant for the "Second Nyquist region" ($F_S/2<F_{IN}<F_S$), provided that it was always within $B_2$. The "always within" requirement is enforced by switching anti-aliasing bandpass or low pass filters into the signal path ahead of the ADC.

We immediately recognize this 'First Nyquist region' as what was related to the earlier discussion of sampling at $F_S>2F_{MAX}$. We are lead to expect that we can correctly deal with signals (and/or their components) from DC up to (but not including) $F_{MAX}$ in frequency, provided frequencies at or above $F_{MAX}$ are absent. But what is this business of a Second Nyquist region? And might there be a Third Nyquist region, and so on? Just what are these additional Nyquist regions?

To explain this notion of Nyquist regions, let's suppose a sampling rate of once every micro-second, and consider a signal frequency of 250 kHz (0.25 MHz) and see what happens. First, the period of the signal to be sampled is 4 µs, and upon reflection it is unlikely that all four one micro-second samples are going to have the same amplitude: there is no group of n-many equally spaced points anywhere along the time axis and within the period of a sine wave that all have the same amplitude, for n greater than two. If there were two samples, then yes, there would be lots ways two samples could have the same amplitude, but once there are more than two, that cannot happen. This is classic Nyquist in action. (It might be objected that there are indeed other periodic waveforms that can produce (n>2)-many samples of equal value. They won't be sinusoids. Let's avoid this worry by agreeing that we have the Fourier decomposition at hand, and pick a sampling rate that will have n>2 for the highest frequency component of interest in that decomposition. What works for that sine wave will automatically work for all the others, and the issue is eliminated, since all the other sinusoids are of lower frequency and n>>2 for them.)

Okay, so what else can we say about the four samples we get? Well, for one thing, we can fit a 250 kHz sine wave to them. After all, that is where they came from. But, and this is what is of interest to us here, so also can a 1.25 MHz sine wave of the same amplitude as before be fitted to those points. Why is this? It is because the period between samples divides the period of the 250 kHz signal into some fractional portion, which in this easy case is one quarter cycle. (That in this example ¼ is a 'nice' number is not important—it could be ⅔ or some truly nasty number. It won't matter.) So we have this correspondence: The first sample gets (say) the location a first quarter of the way along the first cycle of the waveform, the second sample gets a location the second quarter of the way, the third sample gets the third quarter, the fourth sample gets the fourth quarter, and the fifth sample gets the location at the first quarter along the second cycle, and so on. The sequence of locations within a cycle is ¼, 2/4, 3/4, 4/4 followed in the next cycle by the locations ¼, 2/4, et seq.

When we substitute 1.25 MHz for 0.25 MHz, the new signal to be sampled has one and a quarter cycles for every quarter cycle of the old one. The new sequence of samples is: the first sample gets the location at one and a quarter cycles, the second sample get the location at two and half cycles, the third sample gets the location at three and three quarters cycles, the fourth at four and four fourths, and the fifth sample gets the location at five and five fourths cycles. But this is the same sequence of locations within some cycle: ¼, 2/4, 3/4, 4/4, ¼, et seq. It is true that these locations are not ones along the same cycle, but they are for the same respective locations along consecutive cycles. If no one told us where they came from, we would be none the wiser and might well believe that these samples were obtained from the 250 kHz signal. We would be wrong and not know it. We readily see that this mischief (called aliasing) repeats itself with the addition of every integral multiple of the sampling frequency to the signal frequency. So, if we substitute 2.25 MHz for the 0.25 MHz, the new signal has two and a quarter cycles for every quarter cycle of the original one. You can see it coming: the sequence of sampled locations is again equivalent to every quarter of a cycle, albeit distributed amongst successive (but not consecutive) cycles.

To make this sort of thing easy to talk about, we say that the sampling regime, which in this case is to take a sample every one micro-second, has Nyquist regions. The First Nyquist region of the sampling regime in this set of examples is DC to one half the sampling frequency, and is sampling according to the most stringent set of Nyquist rules. The Second Nyquist region is sampling at the same rate as for the First Nyquist region, but upon signals $F_S/2$ higher (i.e., $F_S/2$ to $F_S$) and that, by rights, ought to (but can't, or won't) have twice the sampling frequency, or $2F_S$. The Third Nyquist region is sampling (again) at the same rate as for the First Nyquist region, but upon signals $2F_S/2$ higher (i.e., $F_S$ to $3F_S/2$). To generalize, then, the $N^{th}$ Nyquist region for $F_S$ is to sample at $F_S$ but upon signals that are in the frequency range from $(N-1)F_S/2$ to $NF_S/2$.

It is clear that aliasing is potentially a very serious problem, and the only sure cure is to avoid it. Hence, anti-aliasing filters and band limited operation to within a selected band patrolled by the filters. The idea is that the ambiguity is removed, since the signal that was digitized first went through a known anti-aliasing filter: the digitized values must represent a signal that lies within the pass band of that filter. If need be, a correct reconstruction or interpretation of the digitized result can be formed by 'adding' an appropriate frequency offset depending upon the Nyquist region represented by the anti-aliasing filter that was in use when the digitized samples were taken, and inverting the frequency when the Nyquist region number is even.

This business of consecutive Nyquist regions enforced by anti-aliasing filters works, but there is an unpleasant complication: Two adjacent (in terms of their pass bands) practical anti-aliasing filters do not form a true partition of $B_{IN}$ into $B_1$ and $B_2$. If one had filters whose skirts were truly vertical (each a so-called 'brick wall' filter) one might be tempted to try exactly that. As is well known, however, such 'brick wall' filters are not realizable in practice. Practical filters have real skirts that are not vertical, and filters that have really steep skirts tend to have severe disadvantages in other departments. If we overlap the skirts to ensure at least adjoining passbands, then there will be signals that are within that overlap of the skirts and thus appear within the passbands of both filters. This creates ambiguity about which Nyquist region the signal is to belong—there is in principle no way to tell, since the anti-aliasing requirement has not actually been met for such a signal! Oops! Thus it is that anti-aliasing filters have non-overlapping disjoint guard bands that are to enforce a suitable separation between the passbands, in order to eliminate the possibility of such ambiguity. The unpleasant complication is that signals whose spectral location is within the disjoint region between/within the guard bands cannot be utilized. It is a recognition that there are no adjacent passbands for anti-aliasing filters.

It would seem that we are compelled to waste some of Mother Nature's spectrum. But perhaps this is another case where we should ask a different question in hopes of finding a more agreeable answer. Upon some reflection, we appreciate that the notion of adjacent (which for all practical purposes means overlapping) anti-aliasing filters is propelled by the notion of adjacent Nyquist regions. So, what is it that makes two Nyquist regions adjacent? Perhaps there is sufficient difference between the real meaning of "adjacent or overlapping passbands" for mere filters and the genuine "Nyquist requirement" for sampling band limited analog signals, that we can with grace and elegance recover access to that otherwise 'wasted' spectrum, and wrest it back from the clutches of those evil guard bands. Hmmm. But how to do it?

SUMMARY

A solution to the problem of recovering guard band spectrum at the end of or between consecutive Nyquist regions of a single sampling regime for an ADC clocked at a fixed sampling rate is to create instead a collection of staggered and interleaved Nyquist regions drawn from the various Nyquist regions created by using selected different sampling frequencies $F_S$ as the rate $F_{CLK}$ at which the ADC is clocked. The staggered interleaved Nyquist regions overlap by an amount at least as much as is consumed by the guard bands. For example, and neglecting guard bands, an initial raw band of operation $RB_1$ may be a First Nyquist region for a basic sampling frequency $F_s$. An adjacent raw band of operation $RB_2$ that overlaps $RB_1$ may be the Second Nyquist region for an alternate sampling frequency $2F_S/3$. An adjacent raw band of operation $RB_3$ that overlaps $RB_2$ may be the Second Nyquist region for the basic sampling frequency $F_s$. These raw bands overlap, and $RB_2$ is interleaved between $RB_1$ and $RB_3$:

| | | | | |
|---|---|---|---|---|
| $RB_1$: | DC | to | $F_s/2$ | $1^{st}$ Nyq. for $F_{CLK} = F_s$ |
| $RB_2$: | $(2/3)F_s - (1/2)(2/3F_s) = F_s/3$ | to | $2(2F_s/3)/2 = 2F_s/3$ | $2^{nd}$ Nyq. for $F_{CLK} = 2F_s/3$ |
| $RB_3$: | $F_s - (1/2)F_s = F_s/2$ | to | $2(F_s/2) = F_s$ | $2^{nd}$ Nyq. for $F_{CLK} = F_s$ |

In this example the smallest overlap is $F_s/6$. Suppose we then select widths for guard bands $G_i$ that do not exceed that. Using $G_{B1L}$, $G_{B1U}$, ... $G_{B3L}$, $G_{B3U}$ to denote the respective lower and upper widths for the particular instances of the various guard bands in the associated raw bands (and these various $G_i$ may be all the same, or not), we may describe the actual usable bands $B_1$-$B_3$ as:

| | | | | |
|---|---|---|---|---|
| $B_1$: | DC | to | $(1/2)F_s - G_{B1U}/2$ | $1^{st}$ Nyq. for $F_{CLK} = F_s$ |
| $B_2$: | $(1/3)F_s + G_{B2L}/2$ | to | $(2/3)F_s - G_{B2U}/2$ | $2^{nd}$ Nyq. for $F_{CLK} = 2F_s/3$ |
| $B_3$: | $(1/2)F_s + G_{B3L}/2$ | to | $F_s - G_{B3U}/2$ | $2^{nd}$ Nyq. for $F_{CLK} = F_s$ |

Note:
$G_{B2U}$ should be read as "(the) guard (band) at (usable) band-#2-upper (end)" and $G_{B3L}$ should be read as "(the) guard (band) at (usable) band-#3-lower (end)".

These actual usable bands $B_1$-$B_3$ will overlap at locations where, and by the extent that, the various $G_i$ are less than $F_s/6$.

If the various $G_i$ are each $F_s/6$ then the usable bands will have pass bands that 'just touch,' and not overlap.

Selectable or tunable anti-aliasing filters associated with each band and its selected ADC sample rate ($F_{CLK}$) are used to enforce the staggered and interleaved Nyquist regions and their various guard bands. The different ADC clock rates of $F_{CLK}$ ($F_s$ and $2F_s/3$) may be obtained from two separate sources, from an adjustable source, or from a single source whose output is variably divided. Additional ADC clock rates and anti-aliasing filters with guard bands may be used to operate in still higher Nyquist regions.

DETAILED DESCRIPTION

Figure 1:
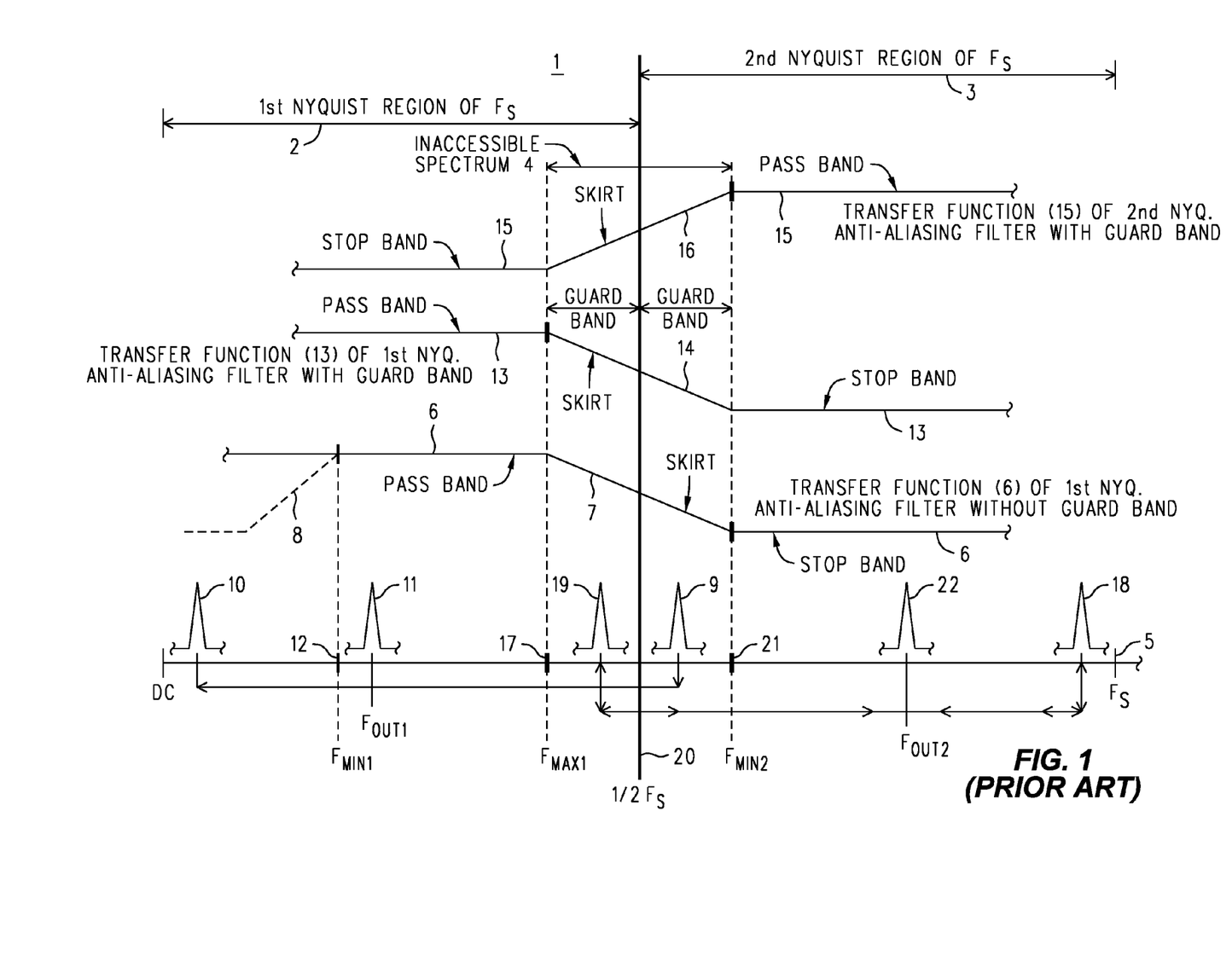
FIG. 1 is a simplified illustration of a prior art sampling regime for the analog properties of a signal and that suffers from inaccessible frequencies in the vicinity of the ends of the Nyquist regions.

Refer now to FIG. 1, wherein is shown a simplified representation 1 of a prior art sampling regime that renders inaccessible some portion (4) of the spectrum with its First (2) and Second (3) Nyquist regions for a sampling frequency $F_S$ (5).

Let's first consider the case where there is simply a low pass filter whose transfer function (6) is located such that the entire passband extends from DC to $\frac{1}{2}F_S$ (the First Nyquist region 2 for $F_S$), while its skirt 7 is located in the lower portion of the Second Nyquist region (3). This might represent an attempt to utilize as much of the First Nyquist region 2 as possible. But notice that signals such as 9 whose locations are along the skirt 7 will not be completely attenuated, and if present, are available to cause aliasing at location 19. Signals sufficiently within the interior of the First Nyquist region, such as $F_{OUT1}$ (11) do represent usable spectrum. But if legitimate signals at a location such as 9 within the Second Nyquist region are possible and apt to be present, then there is a problem if signals at locations such as 19 are also possible, as the aliasing will introduce ambiguity and obscure actual cause and effect.

Another case shown in FIG. 1 is where operation in both the First and Second Nyquist regions is desired, and a pair of anti-aliasing filters are employed whose transfer functions are shown as 13 (for operation in the First Nyquist region 2) and 15 (for operation in the Second Nyquist region 3). In this arrangement skirt 14 enforces a guard band that produces an $F_{MAX1}$ (17). Because skirt 14 does not extend into the Second Nyquist region 3 (i.e., all of the Second Nyquist region is within the stop band of transfer function 13) signals such as 9 and 18 will not create aliases 19 and 10, respectively, and the pass band of 13 can extend down to DC. On the other hand, signals such as $F_{OUT1}$ (11) are limited to $F_{MAX1}$ (17) and below. In a corresponding manner, skirt 16 enforces a guard band between $\frac{1}{2} F_S$ (20) and $F_{MIN2}$ (21). Because skirt 16 does not extend into the First Nyquist region 2 (i.e., all of the First Nyquist region is within the stop band of transfer function 15) signals such as 19 will not create an alias such as 18. On the other hand, signals such as $F_{OUT2}$ (22) are limited to $F_{MIN2}$ (21) and above.

The gap in spectrum between $F_{MAX1}$ and $F_{MIN2}$ is the inaccessible region of spectrum 4 that appears to be the price we must pay to operate in both the First and Second Nyquist regions of $F_S$ (5).

Figure 2:
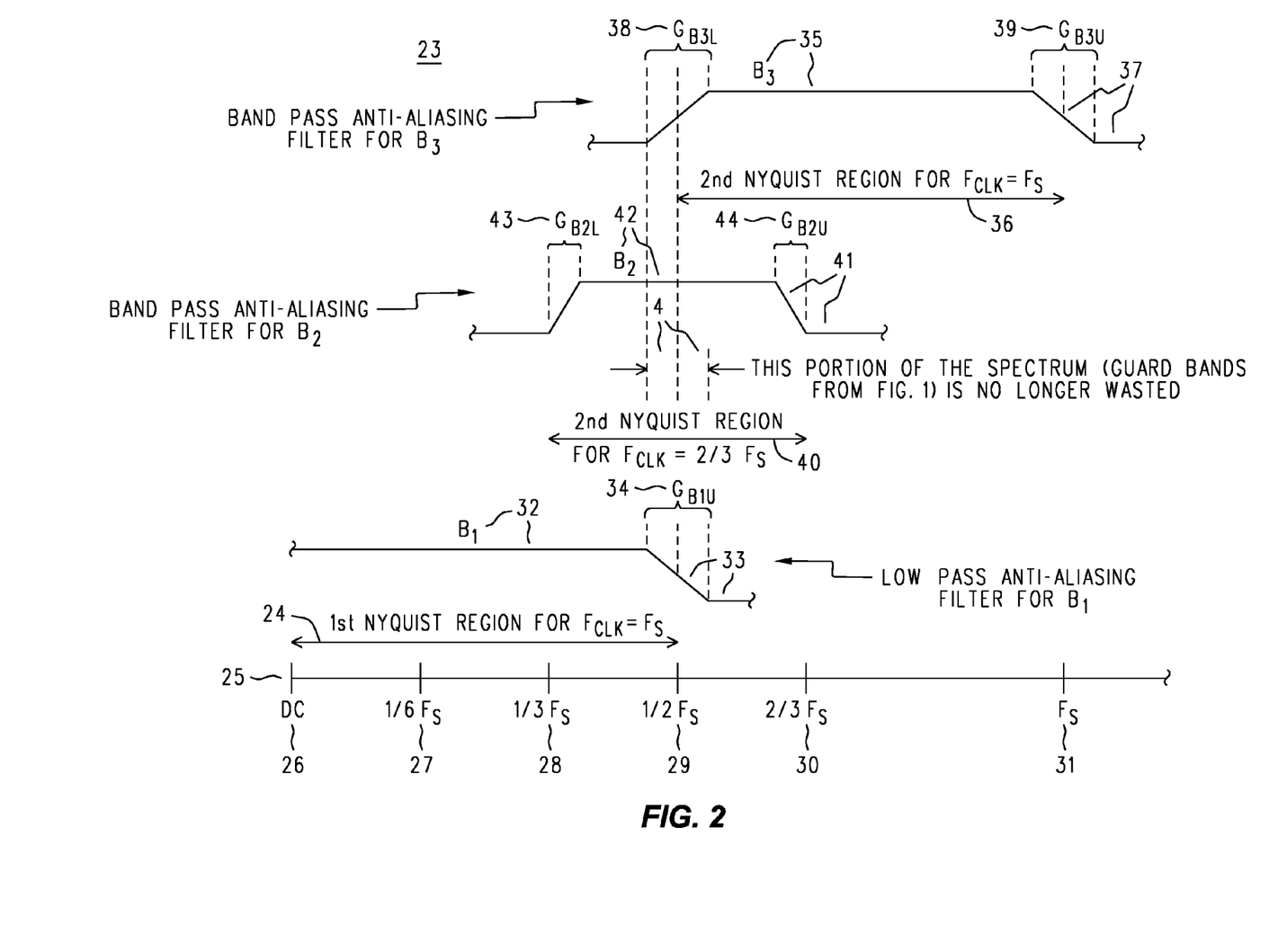
FIG. 2 is a simplified illustration of a sampling regime for the analog properties of a signal using three staggered and overlapping Nyquist regions to avoid wasting the frequencies between two conventional guard bands for consecutive non-staggered Nyquist regions.

Now consider the sampling regime 23 depicted in FIG. 2. Here we suppose that we are not only prepared to switch anti-aliasing filters for sampling the analog properties of signals in multiple bands, but that we are also prepared to vary the clock rate $F_{CLK}$ applied to the ADC that takes the samples (shown in FIG. 3). We shall describe those ADC clock frequencies as different frequencies for $F_{CLK}$, and then state some relation between them in terms of $F_s$ ('$F_{CLK}=F_s$' and '$F_{CLK}=2F_s/3$'). This is convenient and is consistent with the notation used in FIG. 1. It is also consistent with the desirable practice of starting with one clock rate ($F_s$) and using it to derive the other ($2F_s/3$), rather than have two independent clocks and the attendant mischief that their relative drift might cause. As for our choice of $F_s$ and $2F_s/3$, well, that is just one example among many that will work, and it happens to also be a practical one.

In particular, then, FIG. 2 shows a First Nyquist region 24 for $F_{CLK}=F_s$ that runs along a frequency axis 25 from DC (26) to $(\frac{1}{2})F_s$ (29). Associated with operation in a band $B_1$ (32) that occupies this First Nyquist region 24 for $F_{CLK}=F_s$ is a low pass filter whose characteristics (33) correspond to the anti-aliasing filter (13) of FIG. 1. Indeed, band $B_1$ corresponds to the situation described in FIG. 1 for filter (13) and operation between DC and $F_{MAX1}$ (17). In this connection, we note that the skirt (34) of the low pass filter (33) for $B_1$ is a guard band that we call $G_{B1U}$ (think: "Guard on $B_1$-Upper") wherein a stop band of the low pass filter (33) for $B_1$ begins at $(\frac{1}{2})F_s+(\frac{1}{2})G_{B1U}$. Indeed, operation in $B_1$ will be from DC to $(\frac{1}{2})F_s-(\frac{1}{2})G_{B1U}$. So, the bottom one third portion of FIG. 2 is very much the same as described in connection with FIG. 1.

Now consider the top one third of FIG. 2. It describes a band $B_3$ (35) in the Second Nyquist region 36 for $F_{CLK}=F_s$. In this case anti-aliasing requires the services of a bandpass filter whose shape (37) includes guard bands $G_{B3L}$ (38) and $G_{B3U}$ (39). It is clear that $B_3$ runs from $(\frac{1}{2})F_s+(\frac{1}{2})G_{B3L}$ to $F_s-(\frac{1}{2})G_{B3U}$. It is clear that $B_1$ and $B_3$ are disjoint. They are non-adjacent and fail to meet by $G_{B1U}$ or the equivalent $G_{B3L}$.

Now consider the central third of FIG. 2. It depicts a Second Nyquist region 40 for $F_{CLK}=(\frac{2}{3})F_s$, as enforced and protected by a bandpass filter whose shape is 41 and that produces operation in a band $B_2$ (42) that is centered directly over the 'hole' (4) between guard bands, $B_1$ and $B_3$, namely: $[(\frac{1}{2})(F_s-G_{B1U})$ to $(\frac{1}{2})(F_s+G_{B3L})]$. Not only does it 'plug the hole,' as it were, but it does so with room to spare. It achieves this desirable feature because at the low end of $B_2$ the guard band $G_{B2L}$ (43) is neither adjacent nor overlapping with $G_{B1U}$ (34) at the upper end of $B_1$, and $G_{B2L}$ is 'to the left of' $G_{B1U}$ along the frequency axis 25 by some nonzero amount. Similarly, the high end of $B_2$ $G_{B2U}$ (44) is neither adjacent nor overlapping with $G_{B3L}$ (38) at the lower end of $B_3$, and $G_{B2U}$ is 'to the right of' $G_{B3L}$ along the frequency axis 25, also by some nonzero amount.

It is clear in this example that the various Nyquist regions overlap and that their ends are $F_s/6$ apart. For brevity, we shall mean the same thing by saying that bands $B_1$, $B_2$ and $B_3$ are staggered (in this case, by $F_s/6$). If we pick the width of the $G_i$ to be less than $F_s/6$ (or thereabouts) we will achieve the situation described for $B_2$ (how it 'plugs the hole' between $B_1$ and $B_3$). We shall also say that the band $B_2$ interleaves between bands $B_1$ and $B_2$. Note that the spectrum represented by the 'hole' 4 is no longer inaccessible. (And to look ahead, what we need now is an economical way to bring such a $B_2$ into being between $B_1$ and $B_3$, so that all three are staggered.)

It will also be clear to those skilled in the art that other examples of staggered and interleaved bands that plug holes can be produced using different fractional values of $F_s$ as $F_{CLK}$(e.g., $F_s$ and $4F_s/5$), including the notion of using three (or more) related ADC clock frequencies for $F_{CLK}$ and Third (or higher) Nyquist regions. For example, we could use:

| | | | | |
|---|---|---|---|---|
| $RB_1$: | $F_s/2$ | to | $F_s$ | 2nd Nyq. for $F_{CLK} = F_s$ |
| $RB_2$: | $4F_s/5$ | to | $6F_s/5$ | 3rd Nyq. for $F_{CLK} = 4F_s/5$ |
| $RB_3$: | $F_s$ | to | $3F_s/2$ | 3rd Nyq. for $F_{CLK} = F_s$ |
| $RB_4$: | $4F_s/3$ | to | $5F_s/3$ | 5th Nyq. for $F_{CLK} = 2F_s/3$ |
| $RB_5$: | $3F_s/2$ | to | $2F_s$ | 4th Nyq. for $F_{CLK} = F_s$ |

An alternate choice for $RB_4$ would be:

| | | | | |
|---|---|---|---|---|
| $RB_4$: | $9F_s/7$ | to | $12F_s/7$ | 4th Nyq. for $F_{CLK} = 6F_s/7$ |

This latter choice provides a wider $RB_4$ at the expense of a more complicated task for $F_{CLK}$ generation. In this connection, it will be appreciated that in some cases precise ratios need not be used, although there are many where precision would be desirable.

Figure 3:
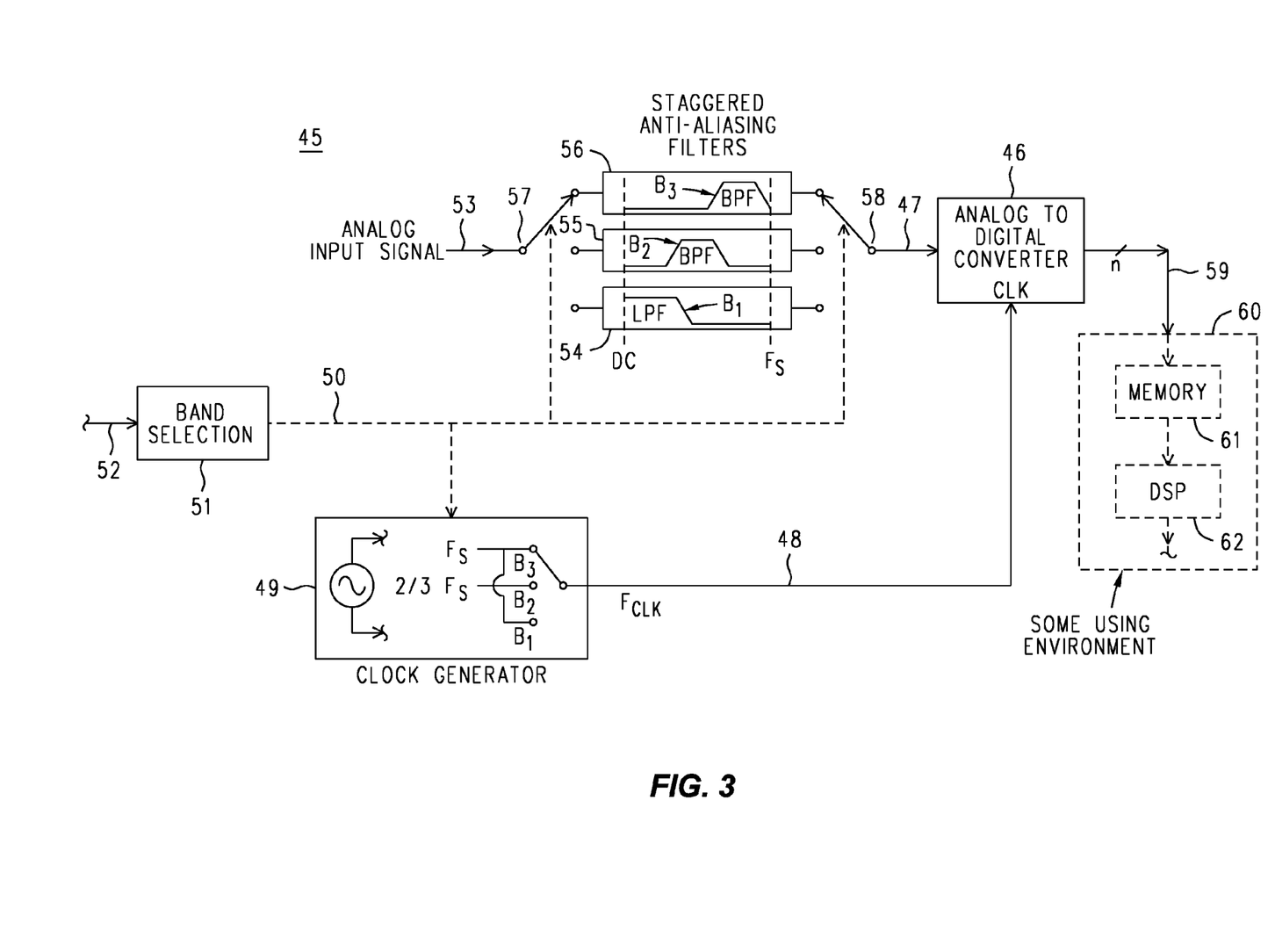
FIG. 3 is a simplified block diagram of a sampling circuit operating in accordance with the regime of FIG. 2.

Finally, refer now to FIG. 3. It is a simplified block diagram 45 of a circuit arrangement that will implement the sampling regime 23 of FIG. 2. At its heart is an ADC 46 that receives its analog input 47 at a selectable rate $F_{CLK}$ (48).

To implement the regime 23 of FIG. 2 $F_{CLK}$ (48) would be $F_s$ for operation in $B_1$ and $B_3$, and $(2/3)F_s$ for operation in $B_2$. A clock signal 48 having the selected frequency $F_{CLK}$ is produced by a suitable Clock Generator 49 responsive to a Band Selection signal 50 that is produced from a Band Selection Circuit 51. Band Selection Circuit 51 is in turn responsive to a suitable control signal 52 produced by some larger environment (not shown) that determines from which band ($B_1$, $B_2$ or $B_3$) the analog properties of an analog input signal 53 are to be sampled.

The analog input signal 53 is applied to a collection of anti-aliasing filters 54, 55 and 56. Filter 54 enforces, or creates, with a guard band, the band $B_1$ (32). Filter 55 enforces, or creates, with guard bands, the band $B_2$ (42), while filter 56 enforces, or creates, the band $B_3$ (35). Which of these filters is in use is determined by the settings or positions of switches 57 and 58, which may FETs or any other suitable type of switching mechanism (e.g., RF relays). The setting or position of the switches 57 and 58 is also controlled by the band selection circuit 51.

It will be appreciated that while we have shown separate selectable fixed-tuned filters with a selection mechanism, tunable filters could be employed, as well. Indeed, a single sufficiently tunable filter could replace one or more of the fixed-tuned filters shown in the figure.

ADC 46 produces a sequence of n-bit digital values 59 that are coupled to a using environment 60 of some sort. There the sequence may be stored in a memory 61, from whence in can be processed in due course, such as by a DSP mechanism 62, and the results put to some further use.

We claim:

1. A method of digitizing an input signal, the method comprising the steps of:
   (a) selecting one of two non-disjoint bands $B_1$ or $B_2$ respectively representing staggered Nyquist regions that are the First Nyquist region for a basic sampling frequency $FS_1$ and the Second Nyquist region for an alternate sampling frequency $FS_2$, where $P/Q$ is a fraction between zero and one and $FS_2=(P/Q)(FS_1)$;
   (b) if band $B_1$ is selected, then:
      (b1) applying the analog input signal to a first anti-aliasing filter, of cutoff frequency $FS_1/2$ less a guard band, to produce a first filtered signal in the band $B_1$;
      (b2) digitizing the first filtered signal at the sampling frequency $FS_1$; and
      (b3) storing the digitized values from step (b2) in a memory; else
   (c) if band $B_2$ is selected, then:
      (c1) applying the analog input signal to a second anti-aliasing filter, of cutoff frequency $FS_2/2$ less a guard band to $FS_2$ less a guard band, to produce a second filtered signal in the band $B_2$;
      (c2) digitizing the second filtered signal at the sampling frequency $FS_2$; and
      (c3) algorithmically processing the digitized values from step (c2).

2. A method as in claim 1 wherein $P/Q=2/3$.

3. A method as in claim 1 wherein $P/Q=4/5$.

4. A method as in claim 1 wherein n is a natural number and $P/Q$ is of the form $$\frac{n}{n+1}.$$

5. A method as in claim 2 wherein the width of a guard band is less than or equal to $FS_1/6$.

6. A method as in claim 4 wherein the width of a guard band is less than or equal to $FS_1/(4n)$.

7. A method as in claim 1 further comprising the step (d) of discovering an analog property of the input signal by applying digital signal processing techniques to the sequence of digital values.

8. A method of digitizing an input signal, the method comprising the steps of:
   (a) selecting one of three non-disjoint bands $B_1$, $B_2$ or $B_3$ respectively representing staggered Nyquist regions that are the First Nyquist region for a first sampling frequency $FS_1$, the Second Nyquist region for a second sampling frequency $FS_2$ and the Second Nyquist region for the first sampling frequency $FS_1$;
   (b) if band $B_1$ is selected, then:
      (b1) applying the analog input signal to a first anti-aliasing filter, of cutoff frequency $FS_1/2$ less a guard band, to produce a first filtered signal in the band $B_1$;
      (b2) digitizing the first filtered signal at the first sampling frequency $FS_1$; and
      (b3) algorithmically processing the digitized values from step (b2); else
   (c) if band $B_2$ is selected, then:
      (c1) applying the analog input signal to a second anti-aliasing filter, of passband $FS_2/2$ plus a guard band to $FS_2$ less a guard band, to produce a second filtered signal in the band $B_2$;
      (c2) digitizing the second filtered signal at the second sampling frequency $FS_2$; and
      (c3) algorithmically processing the digitized values from step (c2); else
   (d) if band $B_3$ is selected, then:
      (d1) applying the analog input signal to a third anti-aliasing filter, of passband $FS_1/2$ plus a guard band to $FS_1$ less a guard band, to produce a third filtered signal in the band $B_3$;

(d2) digitizing the third filtered signal at the first sampling frequency $FS_1$; and (d3) algorithmically processing the digitized values from step (d2).

9. A method as in claim 8 wherein $FS_2=(\frac{2}{3})FS_1$.

10. A method as in claim 9 wherein the width of a guard band is less than or equal to $FS_1/6$.

11. A method as in claim 8 further comprising the step (e) of discovering an analog property of the input signal by applying digital signal processing techniques to the sequence of digital values.

12. Apparatus for digitizing an analog input signal, the apparatus comprising:

a band selection circuit responsive to a control signal indicating a desired frequency band of operation for the input signal by producing at an output a corresponding band selection signal;

first, second and third anti-aliasing filters, of overlapping and staggered pass bands, each having an input coupled to the analog input signal, and each having an output at which appears a respective first, second and third filtered signal;

a signal selection circuit having a selection input coupled to the band selection signal and having three signal inputs respectively coupled to the first, second and third filtered signals, and having an output at which appears a selected one of the first, second and third filtered signals according to the band selection signal;

a clock signal generator having a band selection input coupled to the band selection signal and a sampling clock output at which cycles a sampling clock signal at a selected one of at least two sampling rates having respective frequencies $FS_1$ and $FS_2$ according to the band selection signal;

an analog to digital converter having an analog input coupled the selected one of the first, second and third filtered signals, and having a clock input coupled to the sampling clock signal and that performs analog to digital conversion once every cycle of the sampling clock signal;

the first anti-aliasing filter having a passband within the First Nyquist region of $FS_1$;

the second anti-aliasing filter having a passband within the Second Nyquist region of $FS_2$; and the third anti-aliasing filter having a passband within the Second Nyquist region of $FS_1$.

13. Apparatus as in claim 12 wherein $FS_2=(\frac{2}{3})FS_1$.

14. Apparatus as in claim 13 wherein each of the first, second and third anti-aliasing filters includes at least one guard band of width less than or equal to $FS_1/6$.

15. A method of digitizing an input signal, the method comprising the steps of:

(a) selecting one of two bands $B_1$ or $B_2$ respectively representing Nyquist regions that are the $N^{th}$ Nyquist region for a basic sampling frequency $FS_1$ and the $M^{th}$ Nyquist region for an alternate sampling frequency $FS_2$, where P/Q is a fraction between zero and one and $FS_2=(P/Q)(FS_1)$ and N and M are natural numbers;

(b) if band $B_1$ is selected, then:

(b1) applying the analog input signal to a first anti-aliasing filter, of passband $(N-1)FS_1/2$ plus a guard band to $NFS_1/2$ less a guard band, to produce a first filtered signal in the band $B_1$;

(b2) digitizing the first filtered signal at sampling frequency $FS_1$; and (b3) storing the digitized values from step (b2) in a memory; else (c) if band $B_2$ is selected, then:

(c1) applying the analog input to a second anti-aliasing filter, of passband $(M-1)FS_2/2$ plus a guard band to $MFS_2/2$ less a guard band, to produce a second filtered signal in the band $B_2$;

(c2) digitizing the second filtered signal at sampling frequency $FS_2$; and (c3) storing the digitized values from step (c2) in a memory.

16. A method as in claim 15 wherein N=1, M=2 and P/Q=$\frac{2}{3}$.

17. A method as in claim 15 wherein j is a natural number and P/Q is of the form $$\frac{j}{j+1}.$$

18. A method as in claim 17 wherein the width of a guard band is less than or equal to $$\frac{FS_1}{2(j+1)}.$$

19. A method of digitizing a band-limited analog input signal $S_{IN}$ in a band B with a continuous range of frequencies for $S_{IN}$ larger than half the maximum sample rate, the method comprising the steps of:

(a) selecting a sample rate $F_S$ from a set of at least two sample rates;

(b) selecting a Nyquist region of the sample rate $F_S$ selected in step (a) such that the band B is contained within the selected Nyquist region of $F_S$ and no integer multiple of $F_S/2$ is included in B;

(c) selecting an anti-aliasing filter that will pass the band B while strongly attenuating signals that fall outside the selected Nyquist region and inside other possible Nyquist regions;

(d) filtering the analog input signal $S_{IN}$ with the anti-aliasing filter selected in step (c);

(e) applying the $S_{IN}$ filtered in step (d) to an analog to digital converter operating at the sample rate $F_S$; and (f) algorithmically processing the output of the analog to digital converter.

* * * * *